(12) United States Patent
Spehar et al.

(10) Patent No.: US 10,346,339 B2
(45) Date of Patent: Jul. 9, 2019

(54) SIGNAL PATH ISOLATION FOR CONDUCTIVE CIRCUIT PATHS AND MULTIPURPOSE INTERFACES

(71) Applicant: NXP B.V., Eindhoven (NL)

(72) Inventors: James Spehar, Chandler, AZ (US);
Jingsong Zhou, Gilbert, AZ (US);
Madan Vemula, Tempe, AZ (US)

(73) Assignee: NXP B.V., Eindhoven (NL)

(*) Notice: Subject to any disclaimer, the term of this patent is extended or adjusted under 35 U.S.C. 154(b) by 587 days.

(21) Appl. No.: 14/920,674

(22) Filed: Oct. 22, 2015

(65) Prior Publication Data

US 2016/0041940 A1 Feb. 11, 2016

Related U.S. Application Data

(62) Division of application No. 13/783,026, filed on Mar. 1, 2013, now abandoned.

(51) Int. Cl.
| | |
|---|---|
| *G06F 13/40* | (2006.01) |
| *H04L 12/803* | (2013.01) |
| *H04L 25/02* | (2006.01) |
| *G06F 13/42* | (2006.01) |
| *H03K 5/1252* | (2006.01) |
| *H03K 17/16* | (2006.01) |

(52) U.S. Cl.
CPC ...... *G06F 13/4068* (2013.01); *G06F 13/4282* (2013.01); *H03K 5/1252* (2013.01); *H03K 17/161* (2013.01); *H04L 25/0272* (2013.01); *H04L 47/125* (2013.01)

(58) Field of Classification Search
CPC .................. G06F 13/4282; H04L 47/125
See application file for complete search history.

(56) References Cited

U.S. PATENT DOCUMENTS

| | | | | |
|---|---|---|---|---|
| 6,036,101 | A * | 3/2000 | Hass ................ | G01K 1/028 235/439 |
| 7,564,270 | B1 * | 7/2009 | Zhang ............. | H03K 19/00315 326/115 |
| 2002/0172232 | A1 * | 11/2002 | Dobberpuhl ........ | H03K 17/693 370/537 |
| 2003/0013428 | A1 * | 1/2003 | Marques ............. | H04B 1/0003 455/259 |
| 2004/0095164 | A1 * | 5/2004 | Kernahan ............ | G11C 27/02 327/94 |
| 2005/0258856 | A1 * | 11/2005 | Kishimoto ....... | G01R 31/31712 324/762.02 |

(Continued)

OTHER PUBLICATIONS

NXP; "CBTL05024 Product Brief"; 3 pages (Aug. 1, 2012).

*Primary Examiner* — Gregory B Sefcheck
*Assistant Examiner* — Jael M Ulysse

(57) ABSTRACT

A device can be configured to provide isolation between conductive circuit paths and to selectively connect one of the conductive circuit paths to a shared interface. Each conductive circuit path can include driver circuitry designed to transmit signals according to a particular protocol and a corresponding signal speed. The shared interface can be, in one instance, a connector designed for connection to other devices. The other devices can be configured to communicate over the shared interface using one or more of the particular protocols provided using the different circuit paths.

10 Claims, 4 Drawing Sheets

(56) References Cited

U.S. PATENT DOCUMENTS

| | | | | |
|---|---|---|---|---|
| 2005/0258883 | A1* | 11/2005 | Farjad-rad | G06F 1/04 327/295 |
| 2006/0061405 | A1* | 3/2006 | Zerbe | G11C 7/02 327/336 |
| 2006/0269294 | A1* | 11/2006 | Kikuchi | H04B 10/5051 398/161 |
| 2007/0165710 | A1* | 7/2007 | Alameh | H04L 25/0286 375/220 |
| 2009/0033361 | A1* | 2/2009 | Thummalapally | H01L 27/098 326/44 |
| 2009/0086768 | A1* | 4/2009 | Fairbanks | H04J 3/047 370/545 |
| 2010/0026251 | A1* | 2/2010 | Lam | H02M 3/156 323/273 |
| 2010/0079439 | A1* | 4/2010 | Bar | G09G 3/04 345/212 |
| 2011/0316634 | A1* | 12/2011 | Vasani | H03F 1/0244 330/296 |
| 2012/0280766 | A1* | 11/2012 | Regnier | H01R 13/6469 333/185 |
| 2012/0294058 | A1* | 11/2012 | Best | G11C 5/02 365/51 |
| 2013/0135021 | A1* | 5/2013 | Moore | H03K 5/01 327/167 |
| 2014/0184349 | A1* | 7/2014 | Muljono | H03K 7/02 332/115 |

* cited by examiner

SIGNAL PATH ISOLATION FOR CONDUCTIVE CIRCUIT PATHS AND MULTIPURPOSE INTERFACES

Aspects of various embodiments are directed to circuits and methods designed to preserve signal integrity on interfaces that are designed for multiple protocols.

In certain environments, the demand for devices with higher data throughput continues to increase. This demand has led to the development of new communication protocols and standards, many of which have more stringent demands on signal integrity. For instance, the additional protocols and standards may use a high signal speed to provide high data throughput. Additional demands can result from requirements, such as limitations placed upon voltage and current levels. This increased demand is sometimes directly at odds with other design concerns. For instance, the availability of physical space can be limited in mobile devices due to competing demands of smaller size and increased functionality. Moreover, there can be limitations stemming from concerns over battery life, such as excessive power consumption.

These and other driving factors have resulted in significant changes to communication protocols and standards. The demand for new devices with these new protocols, however, is somewhat reduced by prior devices that use older, slower protocols. Backwards compatibility is not always a feasible option when designing a new protocol. Moreover, different parallel protocols are often offered by different companies, standard setting bodies and other sources. These and other factors are relevant to interfaces that are designed for multiple protocols.

Various example embodiments are directed to circuits designed for use with shared resources and their use and implementation.

Embodiments are directed towards a hierarchical signal routing solution that provides prioritized signal paths for certain signals. The signal routing solution includes multiple levels of switching circuitry or multiplexers that allow prioritized signals to have additional isolation from other signals that can be routed to the same shared resource (e.g., a shared output pin of a multipurpose connector).

According to an example embodiment, a device is useful for reducing high-speed loading between conductive signal circuit paths that share a multipurpose signal interface. The multipurpose signal interface can be configured to pass conductively-carried signals received from respective ones of the conductive signal circuit paths. The effect is to facilitate the use different protocols for communication in each path. The device includes a first conductive signal circuit path that is configured and arranged to transmit an electrical data signal at a signal speed designed for use with a first protocol. A second conductive signal circuit path is configured and arranged to transmit an electrical data signal at a signal speed designed for use with a second protocol and that is slower relative to the signal speed designed for use by the first protocol. A third conductive signal circuit path is configured and arranged to transmit an electrical data signal at a speed designed for use with a third protocol and that is slower relative to the signal speed designed for use with the first protocol. A first multiplexer circuit is configured and arranged to transmit a signal on a first output conductive signal circuit path by selecting, in response to a first control bit, between the second conductive signal circuit path and the third conductive signal circuit path and by electrically isolating the other of the second conductive signal circuit path and the third conductive signal circuit path from the first output conductive signal circuit path. A second multiplexer circuit is configured and arranged to transmit a signal on a second output conductive signal circuit path by selecting, in response to a second control bit, between the first conductive signal circuit path and the first output conductive signal circuit path. Control circuitry is configured and arranged to generate the first and second control bits in response to a selection of one of the first, second and third protocols for use of the multipurpose signal interface.

Consistent with certain embodiments, a method reduces high-speed loading (e.g., capacitive) between conductive signal circuit paths that share a multipurpose signal interface which passes conductively-carried signals received from respective ones of the conductive signal circuit paths in order to facilitate the use different protocols for communication in each path. The method involves transmitting an electrical data signal at a signal speed designed for use with a first protocol on a first conductive signal circuit path. An electrical data signal is transmitted at a signal speed designed for use with a second protocol and that is slower relative to the signal speed designed for use with the first protocol on a second signal conductive circuit path. Another electrical data signal is also transmitted at a speed designed for use with a third protocol and that is slower relative to the signal speed designed for use with the first protocol on a third conductive signal circuit path. Using a first multiplexer circuit, a signal is transmitted on a first output conductive signal circuit path by selecting, in response to a first control bit, between the second conductive signal circuit path and the third conductive signal circuit path and by electrically isolating the other of the second conductive signal circuit path and the third conductive signal circuit path from the first output conductive signal circuit path. Using a second multiplexer circuit, a signal is transmitted on a second output conductive signal circuit path by selecting, in response to a second control bit, between the first conductive signal circuit path and the first output conductive signal circuit path. Using control circuitry, the first and second control bits are generated in response to a selection of one of the first, second and third protocols for use of the multipurpose signal interface.

The above discussion/summary is not intended to describe each embodiment or every implementation of the present disclosure. The figures and detailed description that follow also exemplify various embodiments.

Various example embodiments may be more completely understood in consideration of the following detailed description in connection with the accompanying drawings, in which.

Figure 1:
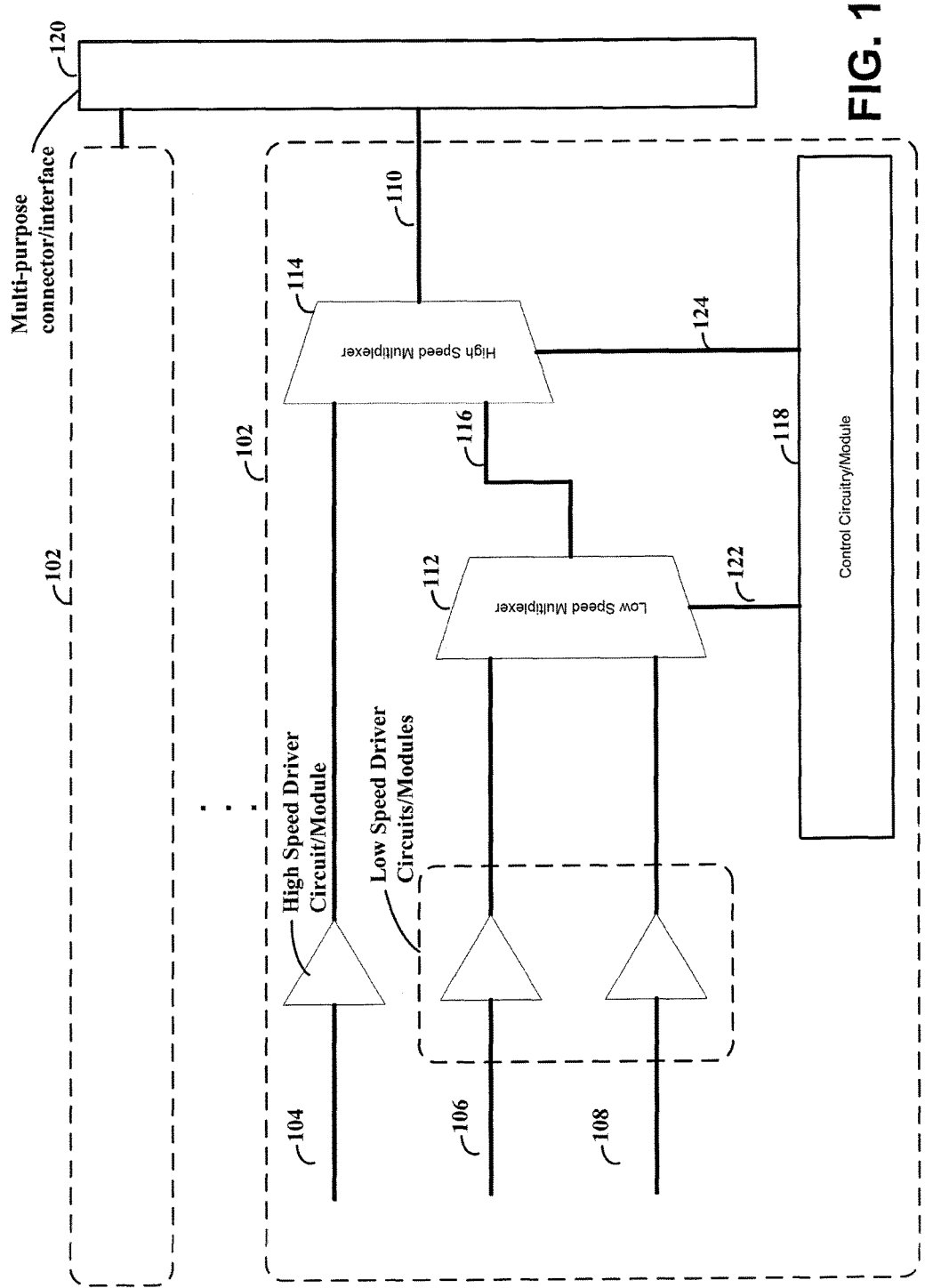
FIG. 1 depicts a block diagram of various circuit components and modules configured to provide isolation between signal paths, consistent with embodiments of the present disclosure.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

Aspects of the present disclosure are believed to be applicable to a variety of different types of apparatuses, systems and methods involving signal isolation between parallel circuit paths that use a common interface. While not necessarily so limited, various aspects may be appreciated through a discussion of examples using this context.

Various example embodiments are directed to a device configured to provide isolation between conductive circuit paths and to selectively connect one of the conductive circuit paths to a shared interface. Each conductive circuit path can include driver circuitry designed to transmit signals according to a particular protocol and a corresponding signal speed. The shared interface can be, in one instance, a connector designed for connection to other devices. The other devices can be configured to communicate over the shared interface using one or more of the particular protocols provided using the different circuit paths.

Consistent with embodiments discussed herein, signal routing circuitry, such as a multiplexer, can be used to selectively pass signals from one of the circuit paths to a shared interface. This selected/active circuit path can then be electrically linked to the shared interface. It has been recognized that the unselected circuit paths connected to routing circuitry can cause undesirable signal distortion on the active circuit path. This signal distortion can include capacitive loading, return loss, insertion loss, crosstalk and interference. Moreover, it has also been recognized that the effect of signal distortion can worsen as the number of circuit paths increases. A further recognition relates to the less stringent signal constraints for certain protocols. For instance, signals with slower signal speeds may have more relaxed signal/timing constraints that facilitate the use of additional circuitry and routing. For instance, additional circuitry and routing may introduce additional signal distortion, signal propagation delays and/or noise.

The term "multiplexer" refers to electrical circuitry that can select one of several input signals and forward the selected input signal to an output. This selection can be responsive to a control signal and allows for the sharing of downstream circuit resources by presenting, at different times, any one of the signals from the inputs. In some embodiments, the unselected signal(s) are not passed to the output. In other embodiments, a particular multiplexer can be configured such that one or more inputs are continually provided to the output, while one or more other signals are only selectively passed. In this regard, the continually provided inputs are effectively wire-ORed with the selectively provided inputs. When used in combination with a hierarchical combination of multiplexers with tri-state capabilities, such embodiments can be particularly useful for reducing undesirable (capacitive) loading for high speed signals.

For instance, unselected signals input to a multiplexer may have undesirable effects on a selected signal. For instance, the gating circuit that is used to selectively pass one signal may introduce capacitive and/or inductive loading on the selected signal. It has been discovered that this loading effect can be particularly pronounced when the multiplexer as the number of input signals increases. Moreover, the loading effect can be particularly problematic at high signal speeds and/or when signals have significantly different signal speeds. The loading effect can also increase with the number of input signals. This can include capacitive loading, which can reduce the effective bandwidth and/or increase signal reflections.

The term "conductive circuit path" refers to an electrical current path (i.e., not a wireless communication) that can include electrical traces, signal conditioning circuitry and signal drive circuitry. The conductive circuit path can be configured and arranged to transmit signals according to one or more protocols and associated signal speeds. This can include careful selection of characteristics for the components in the path. For drive transistors this might include resistance, parasitic capacitance, drive strength, etc. For electrical traces this can include trace size, resistance, capacitance, inductance, routing paths, etc. Other factors can include the use of signal conditioning circuitry, such as signal termination circuits or bias circuits. Collectively, these and other considerations help to set the capabilities of the conductive circuit path.

Aspects of the present disclosure are directed toward the use of hierarchical signal path selection circuitry. This hierarchical circuitry can prioritize certain circuit paths by reducing the number of parallel circuit paths connected to a common routing circuit (a multiplexer circuit). This prioritization can include different levels of routing circuits that allow for a selection between multiple different signals before being forwarded as an input to the common routing circuit, which is shared with the prioritized circuit path. In certain embodiments, the different levels of routing circuits can be separated by a physical distance sufficient to provide isolation between signals that are provided as inputs at different levels of the routing circuit. For instance, a first level can allow for selection between a first path with (relatively) fast signal speeds and a second path that originates from a second level. The second level can allow for selection between two paths with (relatively) slow signal speeds. In this manner, all three signals (two slow and two fast) can be selectively routed to the same output in the first level, based upon selections made at the different levels. As discussed herein, however, the loading on the first (fast) path that is caused by the two (slower) paths is reduced by isolation between input paths to the first and second levels. Consistent with various embodiments, there can be additional levels of the routing circuit, each level providing an additional isolation point for circuit paths that use varying signal speeds.

Various aspects of the present disclosure are directed toward the use of a hierarchical arrangement of multiplexers that have different signal passing capabilities. For instance, a first multiplexer may be designed to accommodate high signal speeds and corresponding stringent signal characteristics/requirements. A second multiplexer can be designed to accommodate lower signal speeds and corresponding relaxed signal requirements. By routing a high speed circuit path directly to the first multiplexer, the signal integrity can be maintained despite more stringent requirements. Slower speed circuit paths can be routed first through the second multiplexer. The output of the second multiplexer can then be routed to an input of the first multiplexer. In addition to propagation delays, loading and reflections resulting from the use of the second multiplexer, there can be additional trace length. Routing the lower speed signal paths with relaxed signal constraints to the second multiplexer makes it possible to use additional multiplexers that may not otherwise be compatible with the overall system requirements. For instance, the use of the second multiplexer may introduce signal distortion and/or delay that would not meet the constraints for a high speed signal protocol.

Turning now to the figures, FIG. 1 depicts a block diagram of various circuit components and modules configured to provide isolation between signal paths, consistent with embodiments of the present disclosure. Module(s) 102 receive signal inputs provided by conductive signal circuit paths (104, 106 and 108), allow for the selection of a one of the received signals and provide the selected signal as an output on a conductive signal circuit path 110. Conductive signal circuit path 110 can then be used to provide the selected signal to a shared multipurpose signal interface/connector 120.

Various embodiments of the present disclosure are directed toward reducing loading between conductive signal circuit paths (104, 106 and 108) that share the multipurpose signal interface 120. Each of the circuit paths can include associated drive circuitry, electrical traces and/or signal conditioning circuitry. Multipurpose signal interface 120 can receive and pass conductively-carried signals received from respective ones of the conductive signal circuit paths. This can be particularly useful for connecting different devices to the multipurpose signal interface 120, where the different devices use different protocols for communication in respective paths.

For instance, a first conductive signal circuit path 104 can be configured and arranged to transmit an electrical data signal at a signal speed designed for use with a first protocol. As non-limiting examples, this first protocol could be one of Serial Peripheral Interface Bus (SPI™) with Universal Serial Bus (USB™), DisplayPort™ and Thunderbolt™. A high signal speed could be represented by signal transitions that occur at rates between 500 MHz and 100 GHz, but other speeds are also contemplated.

In certain instances, the signal speed could be represented by the edge transition speed of a signal. A signal with fast edge transition speed can be more susceptible to signal distortion. For instance, a faster edge transition speed can result in ringing or oscillations (e.g., due to reflections). This type of distortion can be worsened by additional capacitance seen on the transmission path.

A second conductive signal circuit path 106 is then configured and arranged to transmit an electrical data signal at a signal speed designed for use with a second protocol. In certain instances, this second protocol can specify a signal speed that is slower than the signal speed designed for use with the first protocol. A third conductive signal circuit 108 path is also configured and arranged to transmit an electrical data signal at a speed designed for use with a third protocol. This third protocol can also be slower than the signal speed designed for use with the first protocol. In certain instances, the second and third protocols could be the same and/or specify similar signal speeds. In other instances, these two protocols can be different protocols with different relevant signal speeds. As non-limiting examples, these second and third protocols could be Display Data Channel (DDC) and/or Inter-Integrated Circuit ($I^2C$). The signal speed could be on the order of a 100 MHz (e.g., 1 KHz to 1 MHz and/or less than 1 GHz), but is not necessarily limited thereto.

A first multiplexer circuit 112 is configured and arranged to transmit a signal on a first output conductive signal circuit path 116 by selecting, in response to a first control bit 122, between the second conductive signal circuit path 106 and the third conductive signal circuit path 108. The selected conductive signal circuit path is electrically connected and communicatively coupled to the first output conductive signal circuit path 116. The unselected/other conductive signal circuit path is electrically and communicatively isolated from the first output conductive signal circuit path 116.

A second multiplexer circuit 114 can be configured and arranged to transmit a signal on a second output conductive signal circuit path 110 by selecting, in response to a second control bit 124, between the first conductive signal circuit path 104 and the first output conductive signal circuit path 116. In certain embodiments, the second multiplexer circuit 114 can include passive switch components. In other embodiments, the second multiplexer circuit 114 can include active driver circuits (e.g., redriver circuits or buffer circuits). Combinations thereof are also possible.

Consistent with certain embodiments, second multiplexer circuit 114 can be configured to continually pass first output conductive signal circuit path 116 to the second output conductive signal circuit path 110. When the first conductive signal circuit path 104 is selected, this results in the first output conductive signal circuit path 116 to be wire-ORed with the first conductive signal circuit path 104. The first multiplexer circuit 112 can be configured with tri-state capabilities that allow for neither of the second conductive signal circuit path 106 and the third conductive signal circuit path 108 to be passed to the first output conductive signal circuit path 116. This configuration of multiplexers can be particularly useful for reducing capacitive loading on the first conductive signal circuit path 104 relative to a single multiplexer with additional width (more inputs).

Control circuitry 118 can be configured and arranged to generate the first and second control bits (122, 124) in response to a selection of one of the first, second and third protocols for use of the multipurpose signal interface. For instance, control circuitry 118 can be configured and arranged to detect the type of protocol used by a device that is connected to the multipurpose signal interface 120. The control bits (122, 124) can then be set to pass the appropriate signal to the multipurpose signal interface 120 using the conductive signal circuit path 110.

Consistent with certain embodiments, the multiplexers 112 and 114 each represent a single level of switch elements. For instance, there can be a single level of gating transistors for each conductive signal circuit path. In this manner, an input signal line can be routed through a transistor (between source and drain) and the signal line can be selected based upon voltage applied to a gate of the transistor. Consistent with various embodiments discussed herein, a conductive signal circuit path can include multiple signal lines. For instance, the conductive signal circuit path can be configured to function using differential signaling between two signal lines. Whether there are one or more signal lines, internal control logic can be used to activate the proper transistor(s) in response to the control bits (122, 124). Accordingly, when either of conductive signal circuit paths 106 or 108 is selected, their electrical signal passes through two transistors. When the conductive signal circuit path 104 is selected, the corresponding electrical signal passes through a single transistor. In addition to this signal passing through fewer transistors, the number of transistors in the multiplexer 114 is less than if all conductive circuit paths were directly linked to the multiplexer 114.

Particular aspects of the present disclosure recognize that the total signal path length, including conductive trace stubs, can be a relevant factor in meeting stringent signal constraints for high speed signals. Accordingly, it can be particularly beneficial to physically place gating transistors connected to the second output conductive signal circuit path 110 in close proximity. When the first conductive signal circuit path 104 is selected, the signal integrity can be adversely effected by the length (and number) of the connected conductive trace stubs coming from the transistors controlling the passing of first output conductive signal circuit path 116. The close proximity can help to reduce this length; however, the close proximity can also result in additional signal distortion, emanating from the first output conductive signal circuit path 116.

For these and other reasons, embodiments are directed toward multiplexers with a single level of gating transistors that are located in close proximity. There are relatively large distances between the different multiplexers. For instance, the gating transistors of a single multiplexer block/circuit can be located within a small area, whereas the distance from another multiplexer can be several times that of any distance between transistors of the single multiplexer block/circuit.

Figure 2:
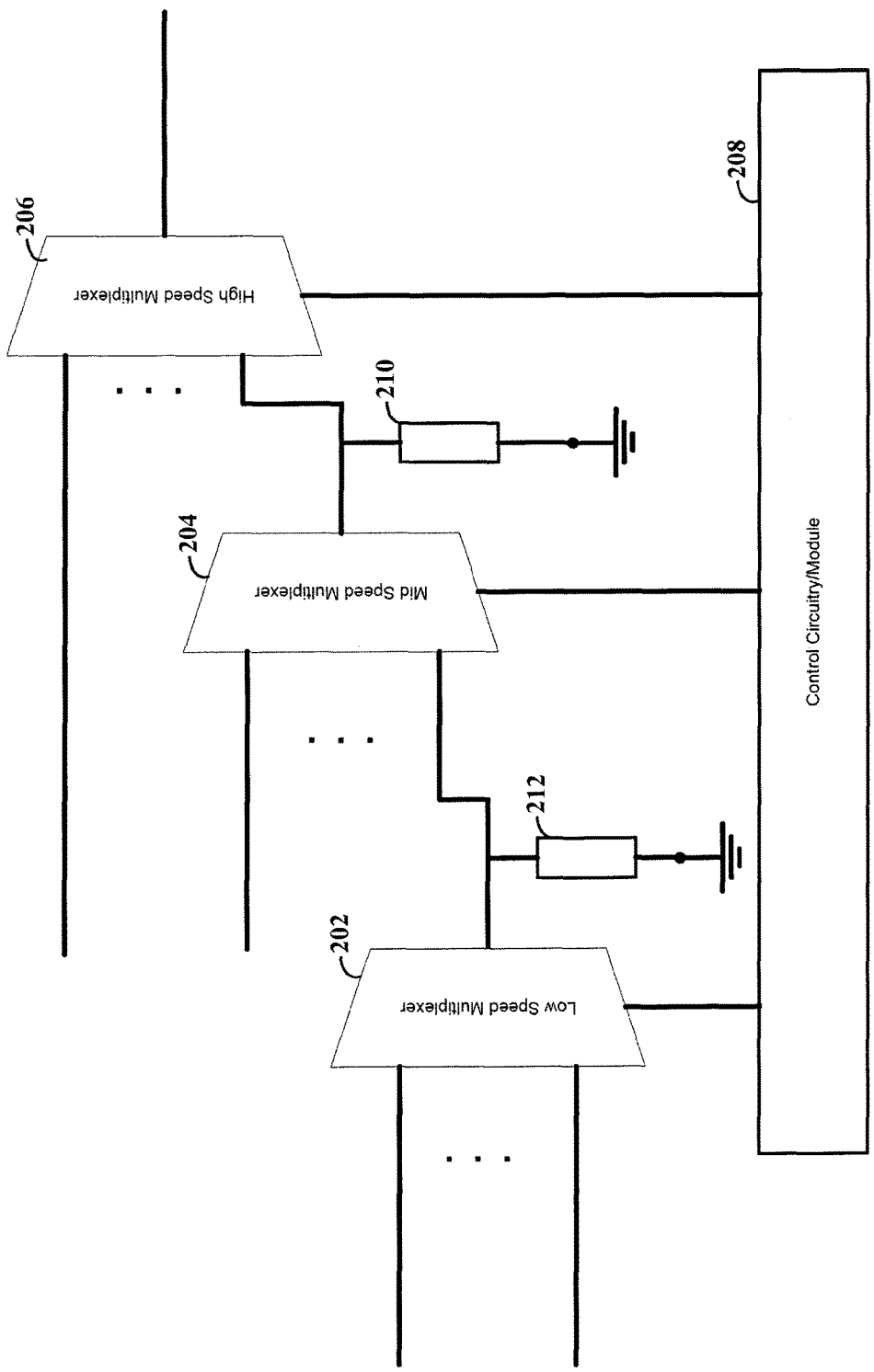
FIG. 2 depicts a block diagram of a multiple level system for providing selection and isolation between input signals, consistent with embodiments of the present disclosure.

FIG. 2 depicts a block diagram of a multiple level system for providing selection and isolation between input signals, consistent with embodiments of the present disclosure. FIG. 2 includes multiplexer circuits/modules (204, 206). These multiplexer circuits 204, 206 can each be configured and arranged to pass signals selected from two or more input conductive signal circuit paths in response to control signals provided by control circuitry/module 208. The multiplexer circuit 206 can be configured to selectively pass signals operating at a relatively high signal speed as well as signals received from the multiplexer circuit 204. A multiplexer circuit/module 202 can be configured to generate a third output conductive signal circuit path by selectively passing signals from two or more additional conductive signal circuit paths. Although not shown, additional multiplexer levels can be added. Each of the multiplexer circuits can be configured to electrically isolate the unselected input from an output conductive signal circuit path. Moreover, one or more of the multiplexer circuits can be configured to select between more than two conductive signal circuit paths.

Consistent with the block diagram of FIG. 2, embodiments of the present disclosure can use a hierarchical configuration of multiplexers in which certain signals are prioritized. This prioritization can be implemented by routing higher priority signals through fewer multiplexers. Moreover, the different multiplexer levels in the hierarchy can be configured according to different timing/signal constraints.

Certain embodiments of the present disclosure also include the use of bias circuits/components 210, 212 between the different multiplexers. Bias circuits 210, 212 can be (optionally) used to prevent the signals from drifting as may occur when the signal lines are not actively driven and/or are isolated. Bias circuits 210, 212 can be implemented using a number of different circuits including, but not necessarily limited to, pull-up/down resistors or current sources.

In certain embodiments, one or more of the different levels of multiplexers can be implemented using the continuously passed and wire-OR embodiments discussed in connection with FIG. 1.

Figure 3:
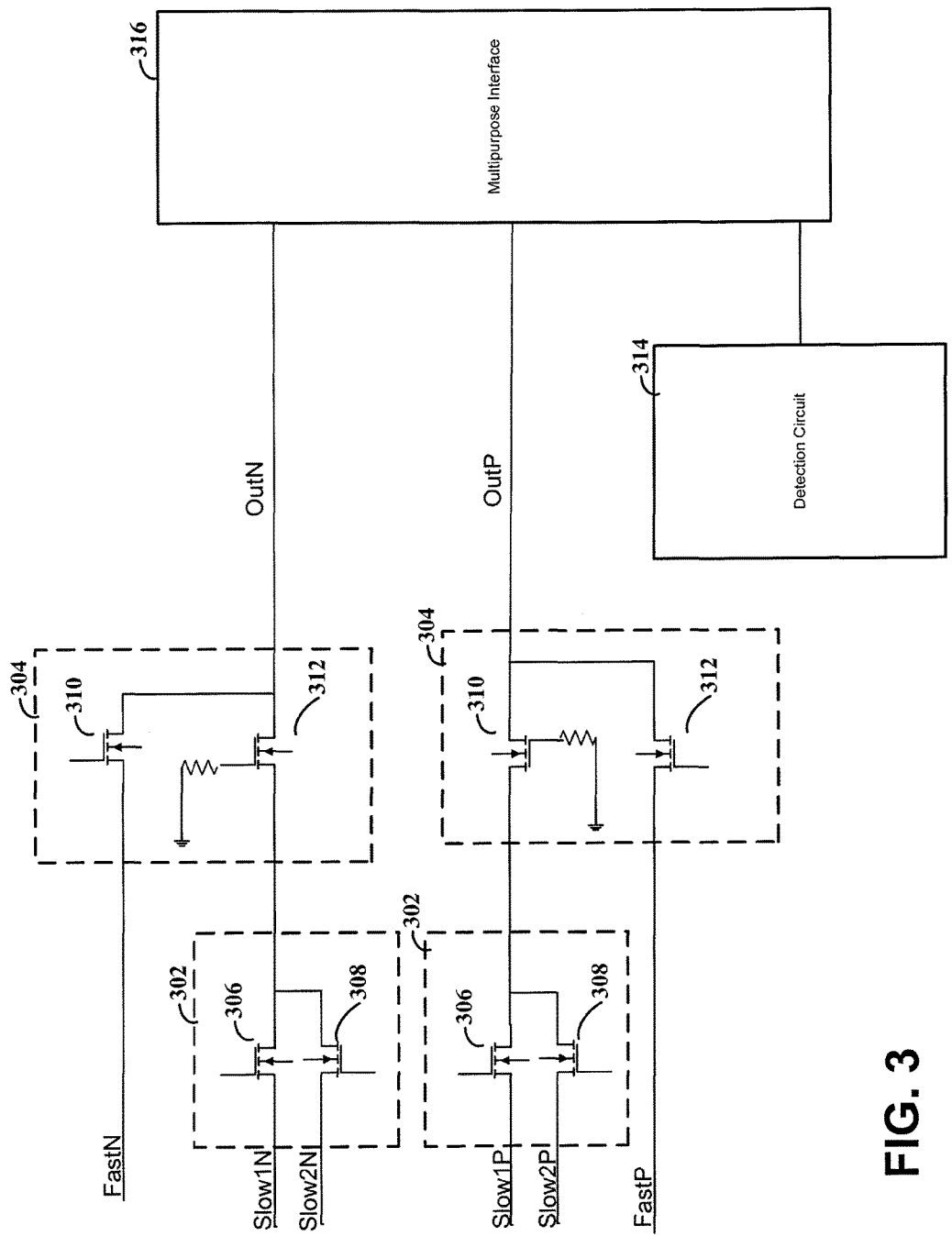
FIG. 3 depicts transistor level logic for a system configured to selectively pass input signals, consistent with embodiments of the present disclosure.

FIG. 3 depicts transistor level logic for a system configured to selectively pass input signals, consistent with embodiments of the present disclosure. Multiplexer blocks 302 and 304 each contain a single level of transistors that are configured and arranged to pass signals corresponding to a selected conductive signal circuit path. Multiplexer blocks 302 and 304 are shown for each signal of a differential signal pair; however, embodiments also contemplate a single set of blocks, which can be used for a single-ended communication line. The selection is carried out using (digital) control logic/circuitry connected to the gate(s) of the transistor(s). Although not shown, the conductive signal circuit paths can also include signal conditioning circuits, which may include, for example, pull-down or termination resistors and/or series resistors.

Multiplexer block 302 can be connected to control circuitry that drives the gates of transistors 306 and 308 according to one of three different states. In the first state, neither of the inputs to multiplexer block 302 is selected. Accordingly, the control circuitry disables both transistors 306 or 308. This results in the output of the multiplexer block to not be actively driven and to be in a tri-state mode. In a second state, the Slow1 signal can be selected by enabling transistor 306. In this second state, transistor 308 remains disabled. In a third state, the Slow2 signal can be selected by enabling transistor 309. In this third state, transistor 306 remains disabled.

Multiplexer block 304 can be connected to the control circuitry so that gate of transistor 310 is driven according to the same three different states. In the first state, the Fast signal is selected, and therefore, the control circuitry enables transistor 310. In both the second and third states, the Fast signal is not selected, and the control circuitry enables transistor 310. Transistor 312 is configured to be always enabled (e.g., by tying the gate to ground through a resistor). This configuration can be particularly useful for reducing the amount of capacitive loading on the Fast signal (e.g., by reducing the gate source capacitance that would otherwise be seen from transistors 306 and 308).

Consistent with various embodiments, the transistors can be implemented using N-type metal-oxide-semiconductor logic NMOS transistors, P-type metal-oxide-semiconductor logic (PMOS) transistors and/or combinations thereof. Transistors other than metal-oxide-semiconductor field effect transistors (MOSFETs) can also be used. Moreover, switch types other than transistors are also contemplated. For instance, one or more microelectromechanical systems (MEMS) can be used for the various switches within one or more of the multiplexers.

The logic diagram of FIG. 3 shows the use of passive transistor gating. Certain embodiments contemplate the use of active driver circuits, whether in addition or in place of the passive transistor gating. For instance, line (re)driver circuits can be used to generate output signals that are compliant with respective communication protocols.

Consistent with embodiments of the present disclosure, detection circuit 314 can be configured to sense the type of device connected to the multipurpose (shared) interface/connector 316. For instance, a connected device can indicate which protocol should be used by providing a particular voltage on one or more lines/pins of the interface/connector. For instance, the detection circuit 314 can use a voltage divider network, a threshold voltage and a comparator to detect one or more different trigger points. Various other mechanisms can also be used to detect the desired protocol including, but not limited to, monitoring of data lines to detect certain protocols.

Figure 4:
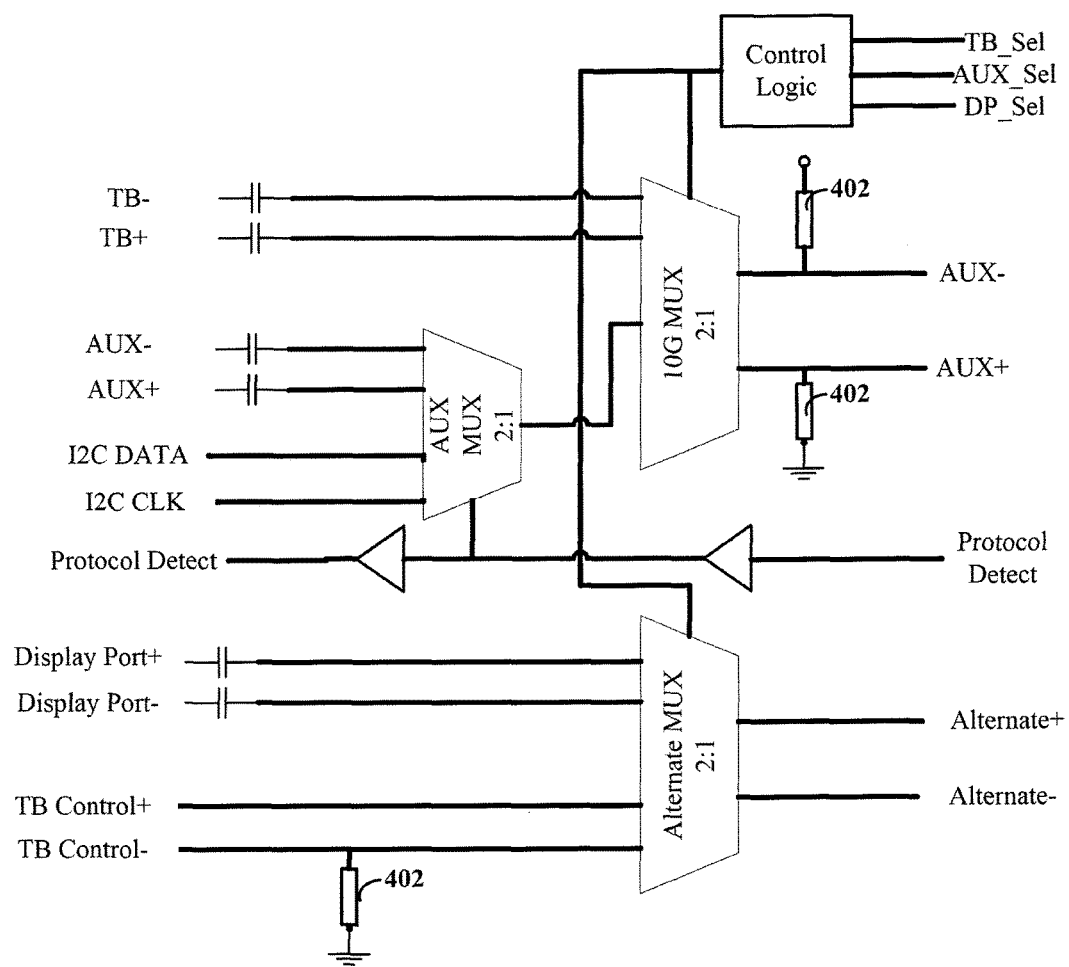
FIG. 4 depicts a block diagram of a system for selectively pass input signals corresponding to particular protocols, consistent with embodiments of the present disclosure.

FIG. 4 depicts a block diagram of a system for selectively passing input signals corresponding to particular protocols, consistent with embodiments of the present disclosure. The 10 G multiplexer 402 can be configured and arranged to pass signals having a data speed of around 10 Gbps. This includes, for instance, data signals for the Thunderbolt™ protocol (TB+, TB−). Selection of the these data signals can be made in response to a control input signal (TB_Sel) that enables a Thunderbolt path through the 10 G multiplexer 402. Additional control signals can also be used to control the various multiplexers, such as AUX_Sel, DP_Sel and Protocol Detect.

As shown in FIG. 4, there can be multiple sets of output signal lines with respective multiplexer(s). For instance, a first set of output signal lines is AUX− and AUX+. This set of signal lines can function as a differential signal pair that selectively passes signals from different protocols, such as Thunderbolt™, control signals from DisplayPort (v1.2) or even I2C signals. A second set of output signal lines is Alternate+ and Alternate−, which form a differential signal pair that can selective pass DPML (DisplayPort Main Link) or alternate signals (e.g., control signals for a Thunderbolt channel). Consistent with particular embodiment, the signal propagation delay can be around 70 ps for the Thunderbold data channel.

Particular embodiments supporting Thunderbolt™ and DisplayPort protocols are directed toward a system that provides a differential TB channel insertion loss of around −1.3 dB (or less) at 5 GHz, a low return loss of around −16 dB (or less) at 5 GHz and a low ON-state resistance of about 8Ω). The bandwidth can be upwards of 10 GHz with off-state isolation of about −20 dB at 5 GHz, low crosstalk of around −25 dB at 2.7 GHz and −18 dB at 5 GHz. The differential input voltage can be up to 1.2 V.

The differential AUX channel can have an insertion loss of around −1.0 dB at 5 MHz and −1.8 dB at 360 MHz. The return loss can be about −18 dB at 5 MHz and −16 dB at 360 MHz. The ON-state resistance can be 12Ω (typical) with 15Ω (maximum), and the bandwidth can be 2 GHz.

The DDC channel can include I2C bus signals for clock (DDC_CLK) and data (DDC_DA). The ON-state resistance can be around 50Ω. The operating frequency can be around 100 kHz with a 3.3 V voltage swing signal. The AUXIO+ and AUXIO− can have outputs with an 85 kΩ AUXIO− pull-up resistor and a 85 kΩ AUXIO+ pull-down resistor, which are both always present.

Particular embodiments are directed toward multiplexers that are configured to operate in a tri-state mode where the output is isolated from all input signals. This can be particularly useful for isolating all input signals from subsequent multiplexers in a hierarchical configuration. The tri-state mode can be enabled when none of the input signals of a particular multiplexer are to be provided to the shared interface/connector.

The particular component types and configurations for signal conditioning circuits are provided as examples and not meant to be limiting. For instance, various component values and configurations can be used depending upon the particular protocols involved and their associated signal constraints and function. Moreover, different circuits may be used for similar protocols, but with different design considerations (e.g., different signal drive circuitry, different trace layout or other variations).

Unless otherwise stated, the various embodiments discussed herein can be used together in a variety of different combinations. Each and every possible combination is not necessarily expressly recited. Various modules and/or other circuit-based building blocks may be implemented to carry out one or more of the operations and activities described herein and/or shown in the figures. In such contexts, a "module" is a circuit that carries out one or more of these or related operations/activities. For example, in certain of the above-discussed embodiments, one or more modules are discrete logic circuits or programmable logic circuits configured and arranged for implementing these operations/activities, as in the circuit modules shown in the Figures. In certain embodiments (e.g., to provide the control logic), the programmable circuit is one or more computer circuits programmed to execute a set (or sets) of instructions (and/or configuration data). The instructions (and/or configuration data) can be in the form of firmware or software stored in and accessible from a memory (circuit). As an example, first and second modules include a combination of a processor hardware-based circuit and a set of instructions in the form of firmware, where the first module includes a first processor hardware circuit with one set of instructions and the second module includes a second processor hardware circuit with another set of instructions.

Based upon the above discussion and illustrations, those skilled in the art will readily recognize that various modifications and changes may be made to the present invention without strictly following the exemplary embodiments and applications illustrated and described herein. For example, the input terminals as shown and discussed may be replaced with terminals of different arrangements, and different types and numbers of input configurations (e.g., involving different types of input circuits and related connectivity). In addition, resistors of various values may be used in the signal conditioning and detection circuits as shown and described, together with different values for other components, as relative to other resistors in the circuit and/or of the particular communication protocol(s). Moreover, a system can be designed to accommodate protocols in addition to those expressly mentioned. Such modifications do not depart from the true spirit and scope of various aspects of the invention, including aspects set forth in the claims.

What is claimed is:

1. A method comprising:

reducing high-speed loading between conductive signal circuit paths that share a multipurpose signal interface which passes conductively-carried signals received from respective ones of the conductive signal circuit paths to facilitate use of different protocols for communication in each path, wherein the multipurpose signal interface includes gating transistors configured and arranged with a first multiplexer circuit and a second multiplexer circuit;

controlling, by generating and using control bits, transmission speeds and signal distortion times over the multipurpose signal interface by selectively using the gating transistors, the first multiplexer circuit and the second multiplexer circuit selectively in order to affect at least one of capacitive and inductive loading on certain signals selected for transmission over the multipurpose signal interface;

transmitting different electrical data signals including an electrical data signal, at a signal speed designed for use with a first protocol and on a first conductive signal circuit path, including an electrical data signal, at a signal speed designed for use with a second protocol that is different than the first protocol and that is slower relative to the signal speed designed for use with the first protocol, on a second conductive signal circuit path, and including an electrical data signal, at a speed designed for use with a third protocol that is different than the first and second protocols and that is slower relative to the signal speed designed for use with the first protocol, on a third conductive signal circuit path;

transmitting, using the first multiplexer circuit, a signal on a first output conductive signal circuit path by selecting, in response to a first control bit among the control bits, between the second conductive signal circuit path and the third conductive signal circuit path and by electrically isolating the other of the second conductive signal circuit path and the third conductive signal circuit path from the first output conductive signal circuit path;

transmitting, using the second multiplexer circuit, a signal on a second output conductive signal circuit path by selecting, in response to a second control bit among the control bits, between the first conductive signal circuit path and the first output conductive signal circuit path; and generating the first and second control bits in response to a selection of one of the first, second and third protocols for use of the multipurpose signal interface, wherein the different protocols are used by different external devices configured to couple to the respective conductive signal circuit paths and being associated with different signal speeds.

2. The method of claim 1, further including transmitting, using the second multiplexer circuit and in response to the second control bit indicating a selection of the first conductive signal circuit path, a signal on a second output conductive signal circuit path that is a wire-OR of the first conductive signal circuit path and the first output conductive signal circuit path.

3. The method of claim 1, wherein the first protocol includes one of Serial Peripheral Interface Bus (SPI) with Universal Serial Bus (USB), DisplayPort and Thunderbolt, and the second protocol includes one of Display Data Channel (DDC) and/or Inter-Integrated Circuit (I²C).

4. The method of claim 1, wherein the second protocol includes one of Display Data Channel (DDC) and/or Inter-Integrated Circuit (I²C).

5. The method of claim 1, further including biasing the first output conductive signal circuit path to prevent voltage drift.

6. The method of claim 1, further including detecting a protocol used by an external device connected to the multipurpose signal interface and wherein the step of generating control bits is responsive to the detection of the protocol used by the connected external device.

7. The method of claim 1, further including detecting a protocol used by a first external device connected to the multipurpose signal interface and enabling and disabling signal conditioning circuitry in response to the detection of the protocol used by the connected first external device.

8. An apparatus comprising:
circuitry configured to reduce high-speed loading between conductive signal circuit paths that share a multipurpose signal interface which passes conductively-carried signals received from respective ones of the conductive signal circuit paths to facilitate the use of different protocols for communication in each path, wherein the multipurpose signal interface includes gating transistors configured and arranged with a first multiplexer circuit and a second multiplexer circuit;
circuitry configured to control, by generating and using control bits, transmission speeds and signal distortion times over the multipurpose signal interface by selectively using the gating transistors, the first multiplexer circuit and the second multiplexer circuit selectively to affect at least one of capacitive and inductive loading on certain signals selected for transmission over the multipurpose signal interface;
circuitry configured to transmit different electrical data signals including an electrical data signal, at a signal speed designed for use with a first protocol and on a first conductive signal circuit path, including an electrical data signal, at a signal speed designed for use with a second protocol that is different than the first protocol and that is slower relative to the signal speed designed for use with the first protocol, on a second conductive signal circuit path, and including an electrical data signal, at a speed designed for use with a third protocol that is different than the first and second protocols and that is slower relative to the signal speed designed for use with the first protocol, on a third conductive signal circuit path;
circuitry configured to transmit, using the first multiplexer circuit, a signal on a first output conductive signal circuit path by selecting, in response to a first control bit among the control bits, between the second conductive signal circuit path and the third conductive signal circuit path and by electrically isolating the other of the second conductive signal circuit path and the third conductive signal circuit path from the first output conductive signal circuit path;
circuitry configured to transmit, using the second multiplexer circuit, a signal on a second output conductive signal circuit path by selecting, in response to a second control bit among the control bits, between the first conductive signal circuit path and the first output conductive signal circuit path; and
circuitry configured to generate the first and second control bits in response to a selection of one of the first, second and third protocols for use of the multipurpose signal interface, wherein the different protocols are used by different external devices configured to couple to the respective conductive signal circuit paths and being associated with different signal speeds.

9. The apparatus of claim 8, wherein at least a portion of the circuitry is further configured to detect a protocol used by a device connected to the multipurpose signal interface and enabling and disabling signal conditioning circuitry in response to the detection of the protocol used by the connected device.

10. The apparatus of claim 9, wherein at least a portion of the circuitry is further configured to bias the first output conductive signal circuit path to prevent voltage drift, and wherein each multiplexer is configured and arranged to enable and disable a single level of transistors to effect the transmission of a signal on the respective and corresponding output conductive signal circuit path.

* * * * *